United States Patent [19]

Sandy et al.

[11] 4,114,119

[45] Sep. 12, 1978

[54] WIDE BAND LOW LOSS ACOUSTIC WAVE DEVICE

[75] Inventors: Frank Sandy, Lexington; Manfred B. Schulz, Sudbury, both of Mass.

[73] Assignee: Raytheon Company, Lexington, Mass.

[21] Appl. No.: 689,398

[22] Filed: May 24, 1976

[51] Int. Cl.² ........................ H03H 9/26; H03H 9/02; H03H 9/30

[52] U.S. Cl. .................................... 333/72; 333/30 R

[58] Field of Search ................... 333/30 R, 72, 71, 10; 310/313; 364/821

[56] References Cited

U.S. PATENT DOCUMENTS

| | | | |
|---|---|---|---|
| 3,883,831 | 5/1975 | Williamson et al. | 333/30 R |
| 3,886,504 | 5/1975 | Hartmann et al. | 333/72 |
| 3,961,293 | 6/1976 | Hartmann et al. | 333/72 |
| 3,967,221 | 6/1976 | Cooper et al. | 333/30 R |
| 3,970,970 | 7/1976 | Worley | 333/72 |
| 3,983,517 | 9/1976 | Weglein | 333/72 |
| 4,023,124 | 5/1977 | Parker et al. | 333/72 |

OTHER PUBLICATIONS

Mason et al., "Physical Acoustics" vol. VII Academic Press New York 1970; Title Page and pp. 250-257, 263-268.

Primary Examiner—Alfred E. Smith
Assistant Examiner—Marvin Nussbaum
Attorney, Agent, or Firm—J. R. Inge; M. D. Bartlett; J. D. Pannone

[57] ABSTRACT

A surface acoustic wave device having substantially all of the surface wave energy produced at an input transducer coupled to the output utilization means. Plural reflecting means upon the surface of a piezoelectric substrate reflect surface waves produced by the input transducer in plural directions. The passband characteristics of the device are determined by the interaction of the transfer properties of each of the reflecters as well as those of the input and output transducers. Devices are described having extremely low insertion loss and wide bandwidth with low sidelobes and steep passband skirts.

8 Claims, 4 Drawing Figures

WIDE BAND LOW LOSS ACOUSTIC WAVE DEVICE

BACKGROUND OF THE INVENTION

1. Field of the Invention

The invention relates generally to surface acoustic wave devices such as couplers, resonators, or filters in which it is desired to obtain a wide bandwidth device simultaneously having low losses and preferably with very low sidelobes and high ultimate rejection.

2. Description of the Prior Art

A surface acoustic wave device having a wide bandwidth, low insertion loss, and low sidelobes or steep passband skirts has long been sought for applications such as IF filtering or radar signal processing because of its relatively small size and ease of fabrication compared with lumped constant devices. In most surface wave devices an input transducer launches surface waves in two opposed directions upon excitation by an externally applied electrical current. However, less than half of the energy within the surface waves produced by the input transducer ever reached the output transducer or surface wave energy extraction means in most previously known devices as the output transducer lay along a linear surface wave propagation path from the input transducer and only received surface waves launched from one of the two directions. In order to overcome these losses, devices were constructed using a non-planar substrate having a surface in the form of a circle or ellipse or two parallel planar surfaces with circular portions. Surface waves launched by the input transducer traveled around the device propagating in both directions around the circular portions of the device to the output transducer. Unfortunately, such devices did not achieve as low an insertion loss as was desired for many applications because a substantial portion of the surface waves were converted to bulk waves as they propagated over non-planar portions of the substrate. The proportion of the surface wave energy converted to bulk waves was lost prior to reaching the output transducer.

Another technique that has been utilized to minimize the bidirectional energy loss has involved the use of complex interdigital transducer designs along with various techniques for adjusting the relative phase of portions of the transducer. All of these so-called unidirectional transducer structures suffer from one or a number of deficiencies. These deficiencies include: narrow passband, poor sidelobe suppression, poor ultimate rejection, difficult fabrication, and poor shape factor.

The attainment of wide bandwidth with low inband loss and high ultimate rejection (the signal rejection outside of the passband of the device) has also been long sought. In general, in previously known wideband devices, the passband of the device was determined for the most part by the passbands of the input and output transducers and the interactions therebetween. Devices have been described in which the overlap of the conductive fingers within the input and output transducers is varied in accordance with predetermined frequency characteristics. Although these techniques have met with some degree of success in improved bandwidth, devices were not constructed which simultaneously have sufficiently wide bandwidth, low inband insertion loss and high ultimate rejection to be useful in many radar signal processing filtering applications.

Resonator-type devices are known in which input surface waves launched by the input transducer propagate around a closed path many times past the output transducer setting up a standing wave pattern along the entire propagation path. By this technique, very narrow bandwidths, typically no more than 0.1% have been obtained. However, low sidelobes and steep skirts have not been demonstrated.

SUMMARY OF THE INVENTION

Accordingly, it is an object of the present invention to provide a surface wave coupler device in which substantially all of the surface wave energy produced by an input transducer is directed towards output utilizing means.

It is also an object of the present invention to provide a surface acoustic wave filter device having an insertion loss of less than 6 db.

It is a further object of the present invention to provide such a surface acoustic wave filter device in which the transfer characteristic or frequency pass response of the entire device is a function of plural transfer functions and not just of the response characteristics of the input and output transducers.

Moreover, it is an object of the present invention to provide a surface acoustic wave filter device having a passband frequency response characteristic shaped by the transfer characteristics of reflecting means disposed upon the substrate of the surface wave device.

Furthermore, it is an object of the present invention to provide a surface acoustic wave device having low inband insertion loss, high ultimate rejection, and a wide bandwidth.

These as well as other objects of the invention are met by providing the combination of means for producing surface waves in a plurality of directions and means for directing substantially all of the surface waves, that is the energy within the surface waves launched by the surface wave producing means, to utilizing means. The surface wave producing means preferably comprises a plurality of conductive strips which may be divided into two groups, wherein strips within each of the groups are interconnected and wherein strips of each of the two groups are positioned between strips of the other one of the groups and at least partially overlapping the strips of the other one of the groups. The amount of overlapping between strips of the two groups may be varied as a function of predetermined frequency characteristics. The directing means may include one or more reflecting means such as a reflecting grating. The reflecting gratings preferably substantially reflect surface waves only within a predetermined range of frequencies.

Objects of the invention may also be met by providing the combination of means for supporting surface waves, input and output transducer means coupled to the supporting means, and means for directing substantially all of the surface waves produced at the input transducer means within a predetermined range of frequencies to the output transducer means wherein the directing means directs the surface waves substantially only within the predetermined range of frequencies. The directing means preferably comprises reflecting gratings which may be formed of a plurality of substantially parallel reflecting elements or grooves, the width and/or the depth and/or spacing between the grooves being determined in accordance with predetermined frequency characteristics. The reflecting gratings may alternately comprise a plurality of substantially parallel reflecting strips disposed upon the surface of the surface wave supporting means in which the width and/or the spacing between the strips is determined in accordance with the predetermined frequency characteristics. The reflecting strips may be formed from a conductive metal or alternatively constructed from a mass loading material, or from grooves in the surface, or ridges on the surface or any combination of these.

The invention may be practiced by a surface wave filter device having input and output transducer means characterized in that the frequency response characteristics of the device are substantially determined by the frequency response characteristics of plural reflecting means. The reflecting means and the input and output transducer means are disposed preferably upon a planar substrate of piezoelectric material. Such devices may be constructed in which the frequency response characteristics of the device are determined by the frequency response characteristics of the input and/or output transducer means as well as that of the reflecting means.

The invention encompasses a surface wave filter device having an insertion loss of less than 6 db and an ultimate rejection of 60 db or more.

The invention further encompasses a surface wave device having a bandwidth of at least 1% of the center of the passband frequencies thereof and with an ultimate rejection of 60 db or more. Such a device is preferably constructed and used as a filter device.

The invention may further be practiced by a surface wave filter device having a bandwidth of at least 1% of the center frequency of the passband thereof and an insertion loss of less than 6 db.

Moreover, objects of the invention may be met by a surface wave filter device having a bandwidth of at least 1% of the center frequency of the passband thereof and an insertion loss of less than 6 db and an ultimate rejection of 60 db or more.

DESCRIPTION OF THE PREFERRED EMBODIMENTS

Figure 1:
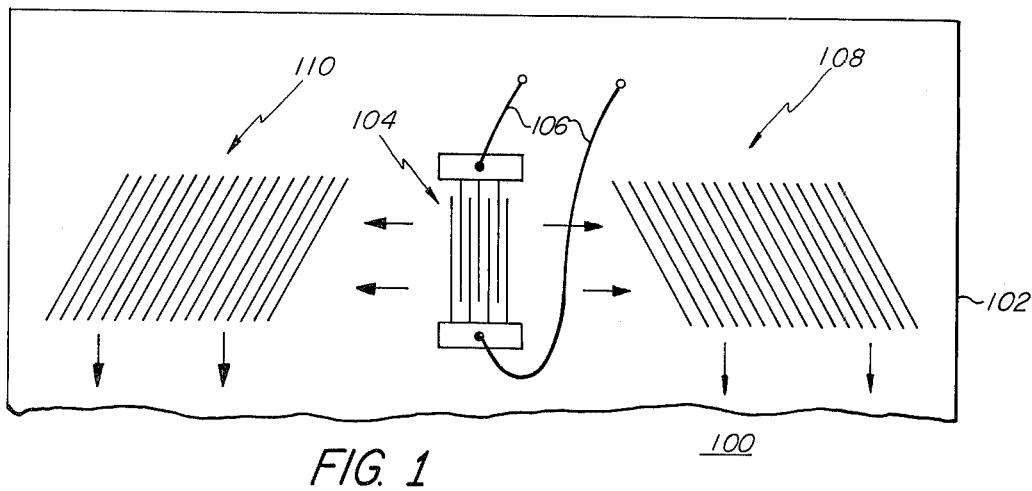
FIG. 1 is a planar view of a surface wave coupler device in accordance with the teachings of the present invention.

Referring first to FIG. 1, there is shown therein generally at 100 a planar view of a coupler device in accordance with the invention. Transducer 104, having plural interleaved conductive fingers is positioned upon the surface of piezoelectric substrate 102. Alternatively, transducer 104 may be located upon a non-piezoelectric substrate with a piezoelectric film overlay above. Upon excitation by an electrical signal of an appropriate frequency upon input leads 106, transducer 104 produces surface waves which propagate outward therefrom in two opposed directions as shown by arrows. In most previous surface wave couplers and devices, surface waves in only one of these directions ever reached the output transducer or output utilizing means. One-half of the energy produced by an input transducer was thereby wasted resulting in a minimum loss of 3 db at the input coupler device.

In accordance with the invention, two reflecting gratings 108 and 110 are located on either side of transducer 104 along the propagation paths of the surface waves launched therefrom. Reflecting gratings 108 and 110 reflect the incident surface waves from input transducer 104 which arrive in two opposed directions away in the same direction. In this manner, the two incident signals arriving in opposed directions are reflected toward the output utilizing means in two parallel paths with the signals propagating in the same direction. As almost the entire energy contained within the surface waves produced by transducer 104 is contained within the two parallel reflected signals, the input transducer loss is avoided and a coupler is thereby produced having substantially no losses.

Reflective gratings 108 and 110 may be constructed using a number of different techniques. Preferably they comprise a plurality of grooves cut into substrate 102, the spacing between the grooves and the width of the individual grooves being determinative of the frequencies at which the incident surface waves are reflected. Generally, surface waves are reflected whose wavelength approximates the spacing along the propagation path between adjacent grooves of gratings 108 and 110. Surface waves having other frequencies continue to propagate outward.

As bulk waves propagate at a different frequency than surface waves, any bulk waves produced will not be reflected at the same angle as surface waves and never reach the output utilizing means. Generally, the more grooves of a given depth provided the higher will be the percentage of incident surface wave energy reflected. The efficiency of the reflecting gratings is also affected by the width of the individual grooves.

Figure 2:
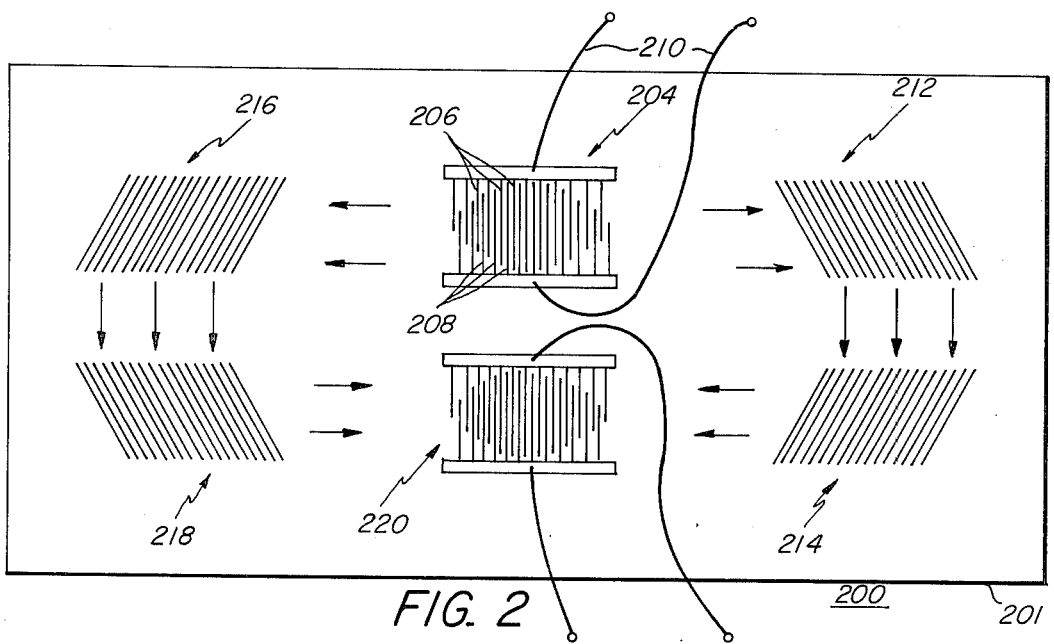
FIG. 2 is a planar view of a surface wave filter device having a wide bandwidth, low sidelobes, and low insertion loss in accordance with the invention.

Referring next to FIG. 2, there is shown therein a surface acoustic wave filter device having low inband insertion loss, high ultimate rejection, and a broad passband in accordance with the invention. Input transducer 204 launches surface waves in two directions as shown by arrows upon excitation by an electrical current on input leads 210. The two surface wave signals produced by transducer 204 are reflected by reflective gratings 212 and 216 at 90° angles toward second reflecting gratings 214 and 218 respectively. Second reflective gratings 214 and 218 again reflect the incident surface wave signals this time both toward output transducer 220. In this manner, substantially all of the surface wave energy in the surface wave signals produced by input transducer 204 within the range of frequencies for which reflecting gratings 212, 214, 216, and 218 reflect reach output transducer 220. With output transducer 220 coupled by output leads 222 to an output terminating impedance having an impedance value of the complex conjugate of the impedance of output transducer 220 substantially all of the surface waves which reach output transducer 220 are absorbed thereby so that the surface waves incident upon output transducer 220 are prevented from propagating back toward input transducer 204 and eventually back a second time to output transducer 220. Ripples in the frequency response characteristics within the passband of the device are thereby eliminated or minimized.

The passband or frequency response of the entire filter device is determined by the convolution of four functions, those being the transfer functions of the input and output transducers and of two of the reflecting gratings. In prior devices, the transfer function of the entire device was substantially set by the convolution of the transfer functions of only the input and output transducers. With the invention, wide bandwidths may be obtained simultaneously with low sidelobes and steep passband skirts along with the aforementioned advantage of extremely low insertion loss.

Reflecting gratings 212, 214, 216, and 218 each are constructed from a plurality of parallel strips which may be either grooves cut into substrate 201 or strips of conductive or mass loading material located upon the surface thereof. As before, the number of strips is primarily determinative of the percentage of incident surface waves reflected. The spacing between adjacent strips generally determines the frequency of surface waves which are reflected. As shown in the embodiment of FIG. 2, the reflecting strips are of uniform width and spacing.

Also, as in the preferred embodiment of FIG. 2, the input and output transducers 204 and 220 are shown as apodized to further improve the frequency response characteristics of the device. That is, the overlap between adjacent fingers is varied in order to give the transducer a desired coupling coefficient versus frequency characteristic. This technique is used to advantage in the present invention by combining apodized input and/or output transducers with frequency selective reflecting gratings overlaid therebetween. In previous filter devices, the overall transfer function could be the convolution of only the transfer functions of the input and output transducers. It is recognized as an advantage with the present invention that the frequency response characteristics may further be tailored to a more desirable characteristic such as one having steep skirts on the passband and low sidelobes as the overall transfer function is the conconvolution of the four transfer functions of the two transducers and two reflecting gratings. To obtain a given overall transfer function, the transfer functions of each of the transducers and reflecting gratings may be substantially the same, each may be different, or some may be different and some alike.

Figure 3:
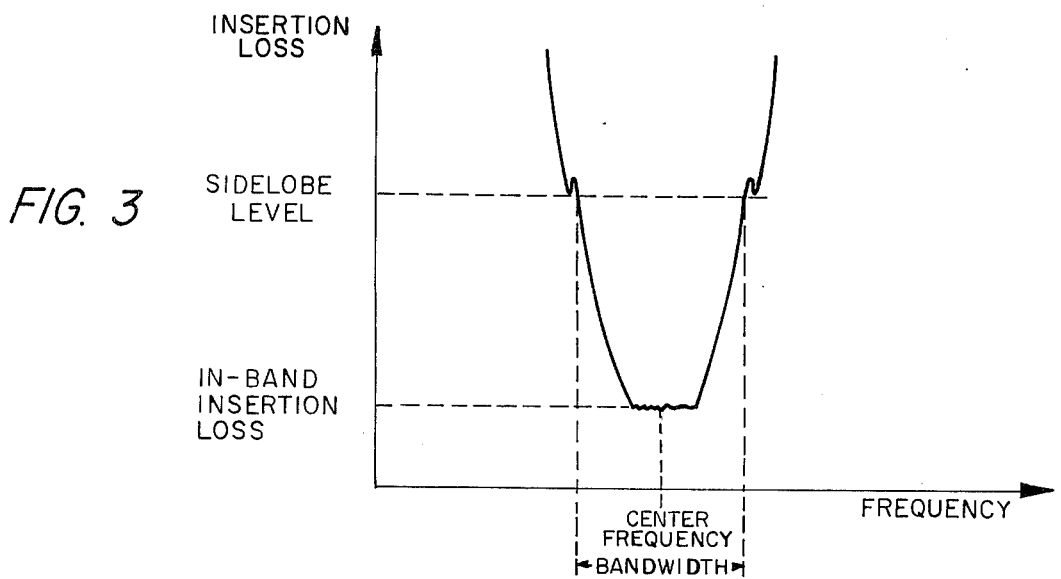
FIG. 3 is a diagram showing the frequency response characteristics of a device constructed in accordance with the teachings of the invention.

Referring next to FIG. 3, there is shown by way of example only, a passband characteristic as can be obtained with a device built in accordance with the invention. Because substantially no energy is lost between the input transducer and output transducer for frequencies within a predetermined range of frequencies, that is within the passband of the device, the in band insertion loss is not limited to 6 db as a minimum but can be made much lower being limited only by residual losses in the substrate material, transducers, and reflecting gratings. It has further been found that with devices constructed in accordance with the present invention, sidelobes may be suppressed to a level of −30 db or lower while still maintaining an inband insertion loss of less than 6 db with the bandwidth at the 3 db points 1% or greater of the center frequency of the passband and with an ultimate rejection of 60 db or more.

Figure 4:
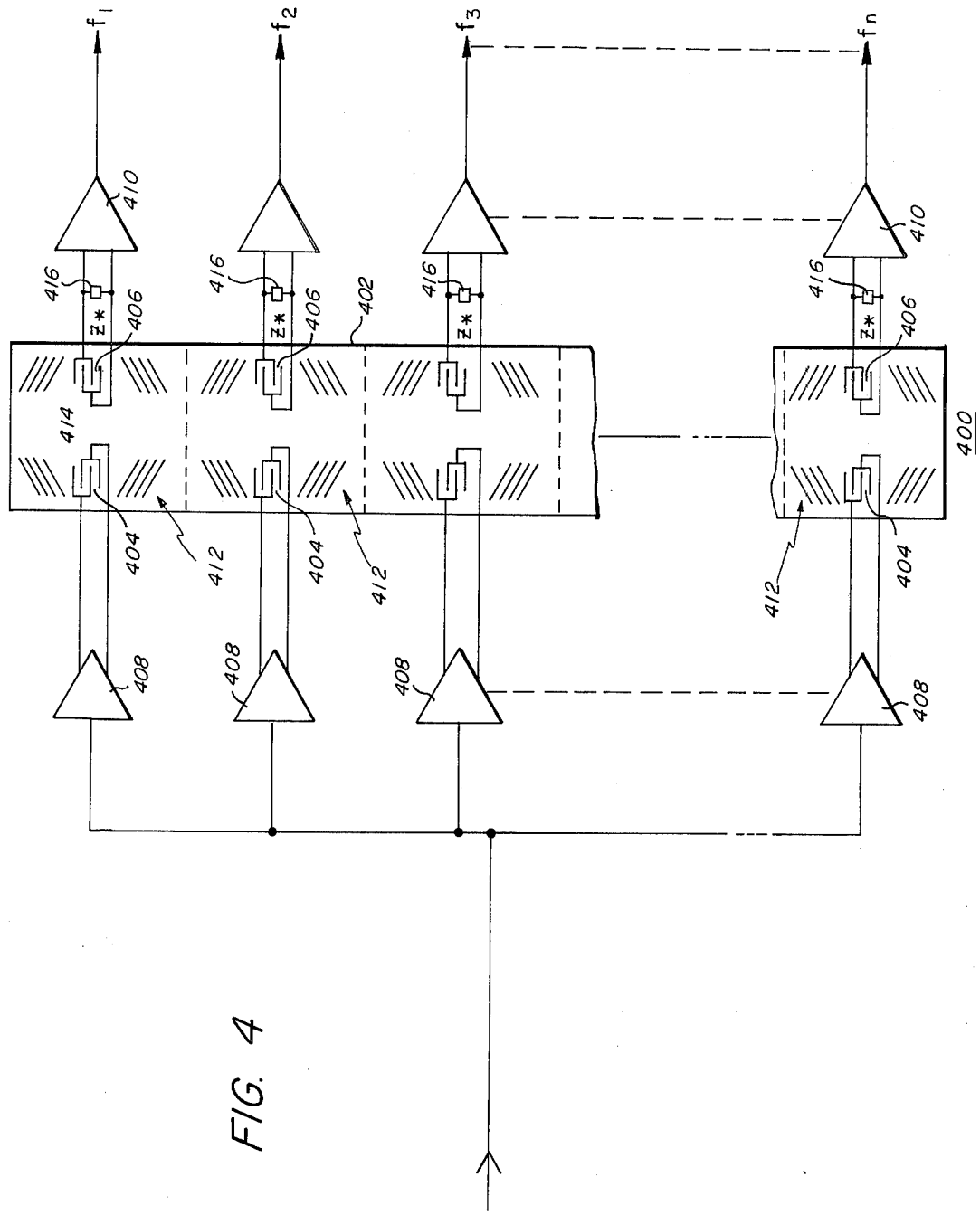
FIG. 4 is a planar view of a surface wave device incorporated in the schematic diagram of a doppler signal radar processor all in accordance with the invention.

Referring next to FIG. 4, an application of surface acoustic wave filter devices in accordance with the invention is shown in a radar system doppler processor. The IF signal from the radar receiver is coupled to the inputs of each of amplifiers 408. Amplifiers 408 amplify the IF signal and provide a buffer to avoid interference between adjacent surface wave filter devices. The outputs from amplifiers 408 are coupled to input transducers 404 within each section 412 of multiple surface acoustic wave filter device 400. Each section 412 is constructed upon a substrate 402 in the same manner as described in conjunction with the device shown in FIG. 2, each section 402 having an input transducer 404, an output transducer 406 and reflecting gratings 414.

The passband of each section 412 is set independently by the frequency transfer characteristics of each of input transducers 404, output transducer 406 and reflecting gratings 414. The center frequency of the passband of each section 412 is different, preferably with the upper one of section 412 having the lowest passband, the next adjacent section having the next highest passband and so forth with the lowermost section having the highest center frequency passband. Each may have the same passband width.

Each of output transducer 406 is coupled to the inputs of one of amplifiers 410 and terminating impedances $Z^*$ 416. $Z^*$ is a load impedance whose value is substantially the complex conjugate of the impedance of output transducers 406 to reduce ripple in the passband as described previously. Output amplifiers 410 amplify the signal produced across load impedances 416 producing a signal output should a signal be present upon the corresponding input transducer 404 for input signals within the passband of that particular section. In this manner, a filter bank is constructed each filter corresponding to a given doppler frequency shift which in turn corresponds to a range of velocities for detected targets. Thus, a signal will be present on the output of one of output amplifiers 410 only should a target having a velocity within the corresponding range then be producing a radar return signal.

Although preferred embodiments of the invention have been described, it is believed that numerous alterations and modifications thereto would be apparent to one having ordinary skill in the art without departing from the spirit and scope of the invention.

What is claimed is:

1. In combination:
 means for supporting surface acoustic waves;
 input transducer means coupled to said surface acoustic wave supporting means for producing surface acoustic waves in a plurality of directions;
 output transducer means coupled to said surface acoustic wave supporting means, said output transducer means being positioned non-colinearly from said input transducer; and
 a plurality of reflecting gratings for directing the surface acoustic waves produced at said input transducer means within a predetermined range of frequencies to said output transducer means, each of said reflecting gratings comprising a plurality of substantially parallel grooves, the width of said grooves being determined in accordance with predetermined frequency characteristics.

2. In combination:
 means for supporting surface acoustic waves;
 input transducer means coupled to said surface acoustic wave supporting means for producing surface acoustic waves in a plurality of directions;
 output transducer means coupled to said surface acoustic wave supporting means, said output transducer means being positioned non-colinearly from said input transducer; and a plurality of reflecting gratings for directing the surface acoustic waves produced at said input transducer means within a predetermined range of frequencies to said output transducer means, each of said reflecting gratings comprising a plurality of substantially parallel grooves, the width and depth of said grooves being determined in accordance with predetermined frequency characteristics.

3. In combination:

means for supporting surface acoustic waves;

input transducer means coupled to said surface acoustic wave supporting means for producing surface acoustic waves in a plurality of directions;

output transducer means coupled to said surface acoustic wave supporting means, said output transducer means being positioned non-colinearly from said input output transducer; and a plurality of reflecting gratings for directing the surface acoustic waves produced at said input transducer means within a predetermined range of frequencies to said output transducer means, each of said reflecting gratings comprising a plurality of substantially parallel grooves, the width of and the spacing between said grooves being determined in accordance with predetermined frequency characteristics.

4. In combination:

means for supporting surface acoustic waves;

input transducer means coupled to said surface acoustic wave supporting means for producing surface acoustic waves in a plurality of directions;

output transducer means coupled to said surface acoustic wave supporting means, said output transducer means being positioned non-colinearly from said input transducer; and a plurality of reflecting gratings for directing the surface acoustic waves produced at said input transducer means within a predetermined range of frequencies to said output transducer means, each of said reflecting gratings comprising a plurality of substantially parallel grooves, the depth of and the spacing between said grooves being determined in accordance with predetermined frequency characteristics.

5. In combination:

means for supporting surface acoustic waves;

input transducer means coupled to said surface acoustic wave supporting means for producing surface acoustic waves in a plurality of directions;

output transducer means coupled to said surface acoustic wave supporting means, said output transducer means being positioned non-colinearly from said input transducer; and a plurality of reflecting gratings for directing the surface acoustic waves produced at said input transducer means within a predetermined range of frequencies to said output transducer means, each of said reflecting gratings comprising a plurality of substantially parallel grooves, the width of, the depth of, and the spacing between said grooves being determined in accordance with predetermined frequency characteristics.

6. In combination:

means for supporting surface acoustic waves;

input transducer means coupled to said surface acoustic wave supporting means for producing surface acoustic waves in a plurality of directions;

output transducer means coupled to said surface acoustic wave supporting means, said output transducer means being positioned non-colinearly from said input transducer; and a plurality of reflecting gratings for directing the surface acoustic waves produced at said input transducer means within a predetermined range of frequencies to said output transducer means, each of said reflecting gratings comprising a plurality of substantially parallel reflecting strips upon said surface waves supporting means, the spacing between said strips being determined in accordance with predetermined frequency characteristics.

7. In combination:

means for supporting surface acoustic waves;

input transducer means coupled to said surface acoustic wave supporting means for producing surface acoustic waves in a plurality of directions;

output transducer means coupled to said surface acoustic wave supporting means, said output transducer means being positioned non-colinearly from said input transducer; and a plurality of reflecting gratings for directing the surface acoustic waves produced at said input transducer means within a predetermined range of frequencies to said output transducer means, each of said reflecting gratings comprising a plurality of substantially parallel reflecting strips upon said surface acoustic wave supporting means, the width of and spacing between said strips being determined in accordance with predetermined frequency characteristics.

8. In combination:

means for supporting surface acoustic waves, said supporting means being substantially planar;

a plurality of input transducer means coupled to said surface acoustic wave supporting means;

a plurality of output transducer means coupled to said surface acoustic wave supporting means for receiving surface acoustic waves produced by said input transducer means;

a plurality of surface acoustic wave reflecting means disposed upon said surface wave supporting means for reflecting the surface acoustic waves produced by each of said input transducer means to a corresponding one of said output transducer means, four of said reflecting gratings being provided for each of said input transducer means, said input transducer means being located non-colinearly from said corresponding ones of said output transducer means;

the passband for signals between each of said input transducer means and said corresponding ones of said output transducer means being determined by frequency response characteristics of said reflecting means; and the passband for said signals between each of said input transducer means and said corresponding ones of said output transducer means being different between at least some of said input transducer means and said corresponding ones of said output transducer means.

* * * * *